United States Patent [19]
Mautz

[11] Patent Number: 5,945,354
[45] Date of Patent: Aug. 31, 1999

[54] METHOD FOR REDUCING PARTICLES DEPOSITED ONTO A SEMICONDUCTOR WAFER DURING PLASMA PROCESSING

[75] Inventor: Karl Emerson Mautz, Round Rock, Tex.

[73] Assignee: Motorola, Inc., Schaumburg, Ill.

[21] Appl. No.: 08/794,698

[22] Filed: Feb. 3, 1997

[51] Int. Cl.$^6$ ........................................ H01L 21/00
[52] U.S. Cl. .............. 438/731; 204/192.12; 204/192.32; 427/534; 216/67; 134/1.2
[58] Field of Search .......... 438/731; 204/192.1, 204/192.12, 192.32, 298.11; 134/1.1, 1.2, 1.3; 216/67; 427/534; 118/504

[56] References Cited

U.S. PATENT DOCUMENTS

| | | | |
|---|---|---|---|
| 3,913,320 | 10/1975 | Reader et al. | 60/202 |
| 4,450,031 | 5/1984 | Ono et al. | 156/345 |
| 4,481,062 | 11/1984 | Kaufman et al. | 156/345 |
| 5,084,125 | 1/1992 | Aoi | 156/345 |
| 5,252,178 | 10/1993 | Moslehi | 156/643 |
| 5,269,881 | 12/1993 | Sekiya et al. | 156/643 |
| 5,366,585 | 11/1994 | Robertson et al. | 156/643 |
| 5,391,275 | 2/1995 | Mintz | 204/192.32 |
| 5,565,058 | 10/1996 | Banholzer et al. | 156/345 |
| 5,647,912 | 7/1997 | Kaminishizono et al. | 118/719 |

*Primary Examiner*—R. Bruce Breneman
*Assistant Examiner*—Luz Alejandro
*Attorney, Agent, or Firm*—Keith E. Witek

[57] ABSTRACT

A method for reducing particles (235) during a semiconductor process. A semiconductor substrate (230) is placed into a processing chamber (210). A processing pressure (108) is applied within the chamber (212). A processing power (102) is applied to the chamber. A grid power (104,106) for removing particles (235) is applied to the chamber (212). The processing power (102) is removed. The grid power (106) is removed after the processing power (102).

40 Claims, 2 Drawing Sheets

METHOD FOR REDUCING PARTICLES DEPOSITED ONTO A SEMICONDUCTOR WAFER DURING PLASMA PROCESSING

CROSS-REFERENCE TO RELATED APPLICATIONS

This application is filed concurrently with an application entitled "Semiconductor Wafer Processing Chamber For Reducing Particles Deposited Onto The Semiconductor Wafer", by Carl Mautz, and assigned to the assignee hereof.

FIELD OF THE INVENTION

The present invention relates generally to integrated circuit manufacturing, and more particularly to, a plasma process which reduces the number of particles deposited on a semiconductor wafer during processing.

BACKGROUND OF THE INVENTION

In the semiconductor arts, semiconductor wafers or substrates are processed in individual chambers which are generally part of a larger cluster platform having multiple chambers. FIG. 1 illustrates one such prior art process chamber 10. The process chamber 10 of FIG. 1 has a chamber housing 11, a chamber lid 14, a bottom shell portion 16, and a chuck 21.

The chamber lid 14 forms a seal with the chamber housing 11 either via a vacuum, fastening mechanism, or gravity to form a chamber 12 within the process chamber 10. The chamber housing 11 has at least one gas inlet 32 for introducing process gasses to the chamber 12, as well as a pumping ring 18 for evacuation of gas from the chamber 12 to the bottom shell 16 area. It is understood that the pumping ring 18 may be a removable baffle (not shown) that interfaces to an evacuation port in the chamber housing 11 for providing uniform evacuation of gases from the chamber 12. The chuck 21 includes a chuck support 22 which houses chuck controls 42 for providing mechanical, thermal, and power control to the chuck 21. Surrounding the chuck support is the bottom shell 16 which provides a pumping port 39 for evacuation of gasses from the process chamber 10. In addition, a liner 20 encircles the chamber 12 within the chamber housing 11, and will be discussed in more detail below.

In operation, a semiconductor substrate 30 is placed upon the chuck 21 by an automated mechanism such as a robotic arm. The semiconductor substrate 30 is generally introduced through an opening in the chamber 12 (not shown). The chamber lid 14 is sealed to the chamber 12 in order to form the enclosed portion of the chamber 12.

In order to assure that the material forming the inner wall of the chamber 12 does not react with the processing of the semiconductor substrate 30, a liner 20 encircles the chamber 12 on an inner surface of chamber housing 11. This liner 20 isolates the processing area of the chamber 12 that would be exposed to plasma 33 from the material comprising the chamber housing 11 to assure that an undesirable reaction does not occur during the semiconductor substrate processing. The liner 20 is a removable liner made of plastic composite materials such as polycarbonates. One of the attributes considered in choosing liner 20 is its ability to adhere to polymers created in the plasma 33. This adhesion is facilitated based on the relatively rough surface of the liner as well as the fact it is an insulator which provides a non-powered, and cooler surface. As the polymer adheres to the liner, particles can be trapped within the polymer on the liner.

During the processing steps associated with the manufacture of semiconductor substrates 30, gas is introduced through the gas port 32, and the ionization of the gases produces a plasma 33 in the chamber area 12. The plasma 33 is excited via a plasma power supply (not shown) in order to produce plasma 33 and react in a desired manner with a semiconductor substrate 32. During the plasma process, particles 35 are produced in the chamber area 12. In addition, these particles can be introduced from a number of sources, including the wafer transport system, such as the mechanics which introduce the semiconductor substrate 30 into the chamber, as well as particles introduced inadvertently with the gas stream through gas ports 32.

The particles 35 become suspended in the plasma 33 above the semiconductor substrate 30 surface due to electrostatic interactions. During processing procedures while power is applied, the particles 35 do not generally cause processing problems, as they are typically suspended above the semiconductor substrate. However, as the power is reduced at the end of a processing cycle, the forces that suspend the particles 35 dissipate allowing them to fall out of the plasma 33 and land upon the semiconductor substrate surface 30 causing contamination. The falling action can be the result of both gravity and electrostatic attraction to the semiconductor substrate 30.

In order to reduce the effects of this contamination, the prior art relies on a polymer film being formed during processing to trap particles 35. These trapped polymers form a film over the lining which over time builds and needs to be physically removed as discussed below. In addition, during a post-process venting step, the liner 20, in combination with the polymer film trap particles 35 only when physical contact occurs. Other prior art steps to reduce particle contamination include the use of a pump purge cycle. A pump purge cycle is used after the processing of the substrate 30 by introducing an inert gas to the process chamber 10 to generate a pressure greater that would normally be experienced during processing. Once this pre-defined pressure is reached, the pump port is opened to allow rapid removal of the introduced gas. This rapid removal creates turbulence which has a sweeping effect carrying particles with the escaping exhaust gasses 40 outside the process chamber 12. A disadvantage of the pump purge cycle is that the pump purge cycle attempts to overcome the static forces affecting a particle with a mechanical force, as a result, the static on the particle is still available to attract the particle to a different undesirable location in the chamber 12. Therefore, a pressure purge does not necessarily remove the contaminants, but only redistributes them.

Another prior art method to assist removal of particles is to physically agitate the chuck 21 to loosen or remove fallen particles. This allows the pump purge mechanisms to better remove the contaminants. The agitation of the chuck can occur during the latter stages of the power cycle or the ramp down cycle, where the plasma energy is being reduced. Performing the agitation of the chuck 21 while the plasma energy is still present facilitates removal of the particles from the substrate surface by a combination of physical and electrostatic forces. A disadvantage of this prior art technique is that while the particle may be removed from the substrate 30, these may not be efficiently removed from the process chamber as the particles are be attracted to other surfaces causing the potential for continued contamination.

Yet another prior art method to assist removal of particles is to change the plasma chemistry, by introducing other gasses, during the latter stages of the substrate 30 processing, or as a separate step. By doing so, the electrostatic nature of the particle is changed such that it is less likely to adhere to various surfaces, allowing for more efficient removal during a pump purge cycle. A disadvantage of this step is that additional gasses require additional total processing time to accommodate the introduction of the new gasses. In addition, the use of this prior step, while reducing the static charge on particles, does not completely physically remove the particles from above the substrate 30.

A further disadvantage of the prior art method is the need to replace or physically clean the liner 20 because of the polymer film build-up. This is required because the polymer film with trapped particles will flake and peel over time introducing additional contaminants to the chamber environment 12. This relatively frequent replacement or cleaning of the liner 20 requires significant and costly down time during which the process chamber 10 cannot be utilized.

The need for an apparatus and method that would allow for improved removal of particles from a processing chamber and substrate surface during a processing cycle without adding significant time to the cycle is desirable. This is especially true as the feature dimensions of devices on the semiconductor substrate decrease, the particles size that become a concern also decreases. Generally, a particle one-third the size of the minimum geometry of a semiconductor substrate feature can cause device defects. As the particles' size decreases, the relative proportion of these particles generally geometrically increases.

It will be appreciated that for simplicity and clarity of illustration, elements illustrated in the figures have not necessarily been drawn to scale. For example, the dimensions of some of the elements are exaggerated relative to other elements for clarity.

DETAILED DESCRIPTION OF THE DRAWINGS

The present invention incorporates an electrically-controlled grid between a liner and an isolation region of a processing chamber. The electrically-controlled grid is powered during a processing step of a semiconductor substrate such that particles suspended within the processing chamber are attracted toward the grid and away from the semiconductor substrate. A non-adhesive liner is utilized to allow particles and polymers to be directed toward a pumping port. The present invention increases yield, requires less down time for cleaning the process environment, and does not impact cycle time.

Figure 1:
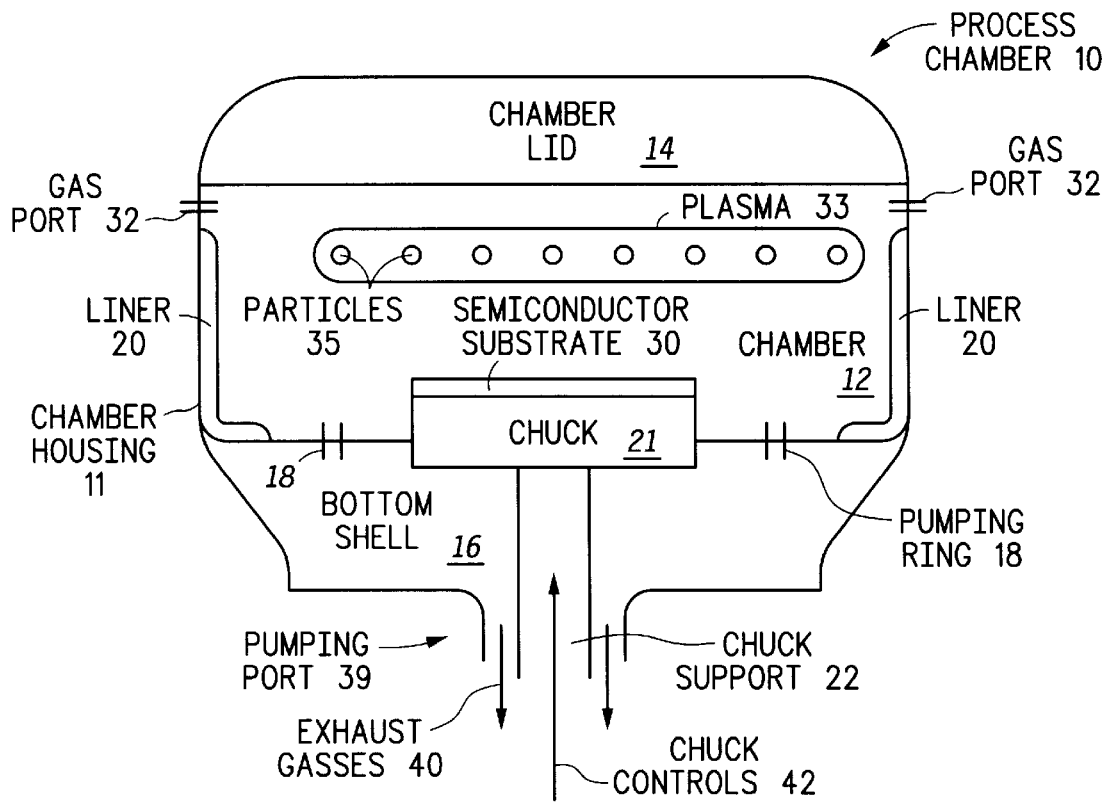
FIG. 1 illustrates, in cross-sectional view, a processing chamber as known in the prior art.
Figure 2:
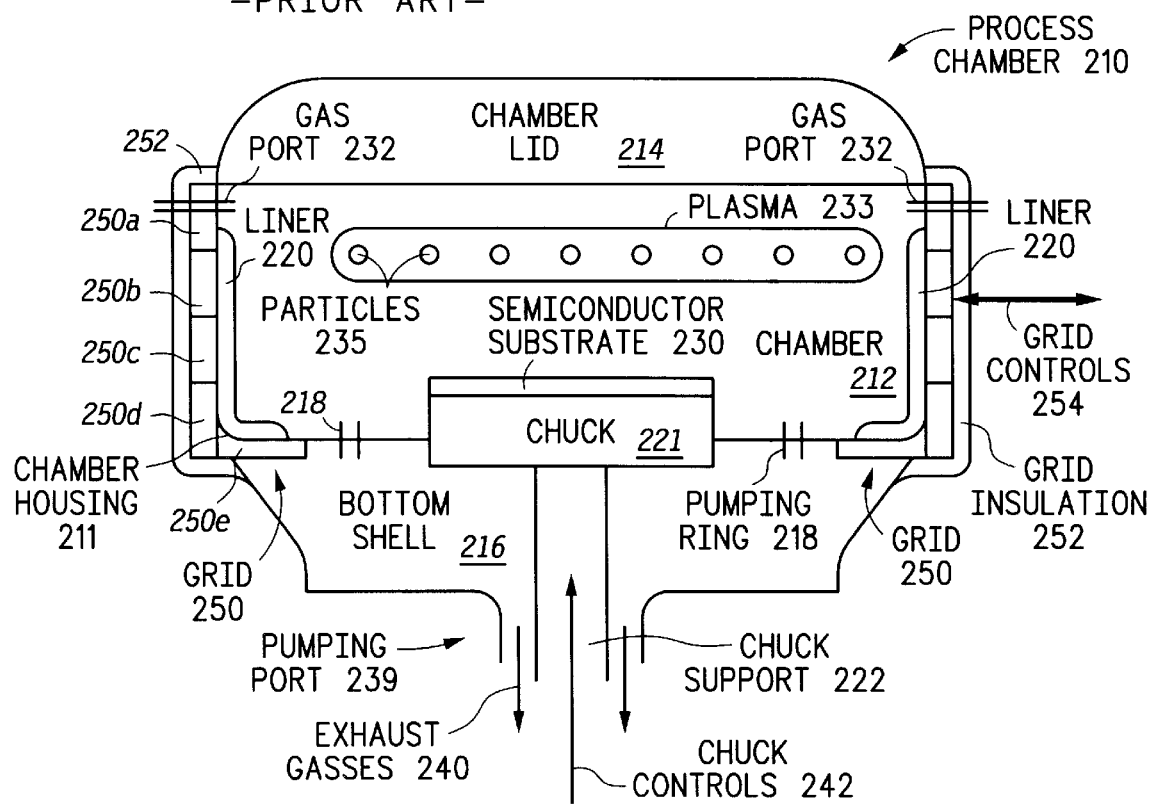
FIG. 2 illustrates, in cross-sectional view, a processing chamber in accordance with the present invention.

FIG. 2 illustrates a process chamber 210 in accordance with the present invention. The process chamber would generally be used during a plasma processing step, and more specifically during a plasma etch process, a plasma deposition process, and sputtering processing systems to avoid particle contamination. The process chamber 210 comprises a chamber housing portion 211, a chamber lid 214 which when fastened to the chamber housing portion 211 forms a seal and a processing chamber 212, a bottom shell 216 which houses and supports a portion of the chuck 221, chuck support 222, and chuck controls 242. In addition, the process chamber 210 includes one or more gas ports 232, and a pumping ring portion 218. In addition, the process chamber 210 includes a grid 250 which generally encircles the chamber area 212 and is positioned relative to the liner 220 such that the liner is between chamber area and the grid 250. A grid isolation portion 252 encircles the chamber portion and resides on the outside, relative to the chamber portion 212, of the grid 250. The gas ports 232, in a preferred embodiment reside such that they do not penetrate the grid, however, this is not a critical requirement. In addition, it is understood that their actual location in the process chamber 210 can vary relative to the semiconductor substrate. Finally, a grid control signal 254 is shown to connect to the grid 250.

In operation, the grid 250 is capable of being controlled such that a potential can be induced upon the grid 250. The grid 250 is manufactured from a conductive material, is annular and encircles the processing chamber 212. As a result, the induced potential can be used to influence the particles 235 migration toward the liner 220. By powering the grid 250 as the plasma ramps down, the particles 235 will not fall and contaminate the semiconductor substrate 230 during a power down portion of the plasma 233.

By attracting the particles 235 toward the liner 220, one of several mechanisms can remove the particles 235 from the chamber area 212. First, the exhaust gas 240 may remove the particles from the processing chamber 210. Next, the particles 235, when in polymer form, may interact with the liner 220 such they form a coating on the liner 220, hence removing the particles from being suspended in the plasma 233 above the semiconductor substrate 230. In yet another embodiment, a liner 220 could be used that is "slick", or non-adhesive, such that the particles 235 would not have a tendency to interact with the liner 220. A non-adhesive liner is obtainable by numerous known methods, including coating a polycarbonate liner with materials such as silicone or other materials to reduce surface adhesion. By reducing the surface irregularities over the prior art liner 20, the amount of particles that will adhere to the liner 220 is reduced.

The use of a non-adhesive liner 220, has an advantage over the prior art in that particles can be more easily removed from the process chamber 212 by the exhaust gasses. The prior art, however, teaches the use of an adhesive liner 20 such that the particles 235 would have a tendency to adhere to the liner 220. Therefore, using a modified liner that is less adhesive than a prior art liner reduces the need to replace liner 220 as frequently, and particle build up would be less on a non-adhesive liner. However, it should be noted that the present invention is advantageous even with a prior art liner in that attracting the particles 235 from being suspended toward the liner, maintains a significant advantage over the prior art.

The grid control signal 254 would be used to control the electrical potential on the grid 250. The grid control signal 254 can be controlled by a microcontroller or microprocessor such that it is a portion of an automated process. In a preferred embodiment, the control of the grid control signal 254 would be controlled by the same control mechanism that controls the overall processing flow responsible for controlling overall operation of the process chamber 210. In addition, grid 250 may comprise of several individual portions as illustrated by portions 250a through 250e.

In a preferred embodiment, the grid portions 250a through 250e are concentric to one another such that a portion 250a would encircle an upper most portion of the chamber 212, or a portion 250e would encircle a lowest portion of the chamber 212. By doing so, the particles 235 can be attracted to various elevations within the chamber 212. The advantage of such a configuration is that when particles are known to be suspended at a certain distance above the semiconductor substrate 230, the grid controls 254 can control the grid 250 portion closest to the particles in order to pull the particles away from the chuck in such a manner to reduce contamination of the semiconductor substrate 230.

Figure 3:
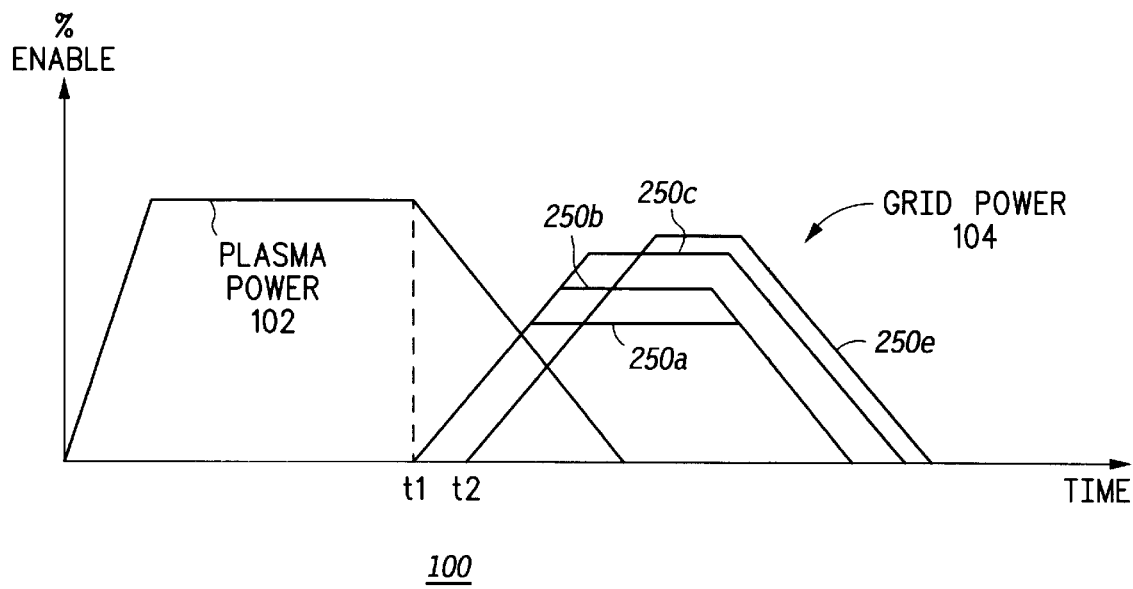
FIG. 3 illustrates, in graphical form, a relationship of plasma power being applied relative to grid power over time in the process chamber of FIG. 2 in accordance with the present invention.

In order to better understand the use of the individual segments of 250a through 250e, FIG. 3 is referenced. FIG. 3 illustrates the relationship between power being applied to the plasma 233, or chamber 212, as represented by graph portion 102 of FIG. 3, and the grid power 104 applied to the grid 250 itself. The grid power 104 comprises graphical representations for many of the grid segments as represented by sub-portions 250a through 250e. During the processing of the semiconductor substrate 230, the chamber plasma power is initially turned on at the beginning of the processing steps by ramping it up to a given level.

Once a desired chamber power level is obtained, it is maintained such that the substrate 230 can be further processed. At the end of the processing portion, the plasma power 102 is ramped down. Note that while the slope of the ramped down portion is showing to be different than the ramp-up portion of the plasma power 102, this is for illustration purposes only, and is not used to reflect the actual relationship between ramp-up and ramp-down.

The chamber plasma power is ramped down such that an electrostatic shock is not induced upon the substrate 230. At the time t1, the chamber plasma power begins its ramp down process the grid power 104 portion begins to turn on. Thus, while the electrostatic influence over the particles 235 is being reduced because of the reduction in plasma power 102, it is increased as a result of the increased grid power 104. This attracts the particles 235 toward the grid 250. As illustrated in FIG. 3, as the plasma power 102 ramps down, the grid power 104 ramps up. It should be noted that while smooth ramps are indicated in FIG. 3, it is understood that the ramp may actually be a step process as opposed to a continuous ramp process and the illustration is not meant to limit the present invention.

FIG. 3 illustrates a number of potential relationships between the individual grid elements. For example, it is shown in FIG. 3 that grid elements 250a, 250b, and 250c begin their ramping process at the same time as represented by time t1. It is further shown that grid segment 250a's power is maintained at a lower level than that of 250b and 250c which continue to ramp to higher power levels. Conversely, it would be possible for 250a, 250b, and 250c, to represent grid segment powers having different ramp rates such as that they would not have a common rise slope. In addition, since the segments are independently controlled, they can have different powers as well.

Next, it is illustrated at time t2 that a grid power is applied to segment 250e which then ramps to a predetermined power level, which for illustration purposes is above the power level of segments 250a, 250b and 250c. Grid segment 250a and 250b are shown to follow a simultaneous power down curve having simultaneous power down slopes, while segment 250c begins a power down segment after that of 250b and 250a. Additionally, 250e is shown to follow an independent power down path, which occurs after the power down of 250a–250c. In summary, it is understood that for purposes of the invention, the individual grid segments can be controlled independently through the grid control signals 254 such that their slopes, power levels, and times of application and de-application can be controlled independently.

Figure 4:
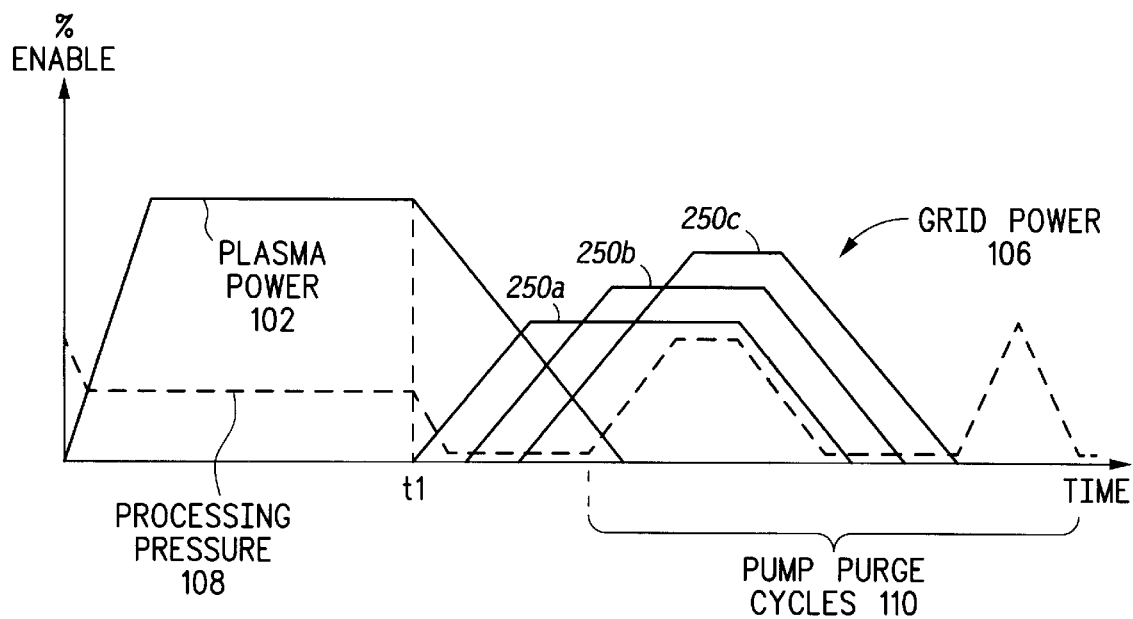
FIG. 4 illustrates, in graphical form, the relationship of plasma power being applied relative to grid power, and a pump purge cycle in the process chamber.

FIG. 4 illustrates, in graphical form, a preferred embodiment of the relationship between the plasma power 102, grid power 106, and a processing pressure cycle 108. A processing pressure cycle 108 is a cycle which controls the pressure and flow of gases within the process chamber 210. At the beginning of the processing cycle as illustrated in FIG. 4, the processing pressure 108 decreases the pressure within the process chamber 210. This is generally done at the same time that processing gases are being introduced into the chamber 212. Once a predetermined processing pressure is obtained, it is maintained substantially constant throughout the remainder of the plasma process. At the end of the plasma process, when the power and gas flow is turned off, the processing pressure 108 drops to a base pressure, which is preferably the lowest obtainable pressure in the system. By reducing pressure within the chamber 212 and simultaneously powering-up the grid 250, particles can be more efficiently directed away from the area above the chuck 221, than in the prior art embodiments that do not have such a grid to attract the particles.

Therefore, FIG. 4 illustrates the relationship between the plasma power, the process chamber pressure 108, and the grid power 106. It is illustrated that in conjunction with the end of the plasma power 102 being applied, or at some period after or before, that the grid power 106 is applied. While the grid 250 is capable of being powered before the end of the stable plasma power, this could effect the plasma processing dynamics, requiring re-characterization of the process.

Continuing with the grid power process, the grid power 106 would first comprise a step which begins with the powering of the element 250a which is the furthest distance above the chuck 221. As discussed previously, the powering of 250a first depends on the precise location of the particles 235 within the chamber 212. For example, if the particles 235 reside at the level of element 250b, that element can be turned on first, or in unison, with element 250a. By doing so, the particles are drawn away from the chuck 221 in such a manner that they do not fall on the semiconductor substrate 230. Subsequently, element 250b would be powered and ultimately obtain a powered level greater than that of element 250a. In addition, each of the following segments, 250c through 250e, would be powered somewhat greater than that of the prior element as exemplary illustrated in FIG. 4 via the three upper segments 250a through 250c.

In a similar, but reverse fashion, the elements 250a through 250e would be sequentially de-powered as exemplary illustrated for only segments 250a–250c in FIG. 4 herein. By doing so, any particles initially attracted to the element 250a would now be attracted to the greater power of element 250b, which resides adjacent to element 250a. In effect, a transfer of the particles 235 from one element, 250a, to another element, 205b, occurs. By controlling the elements in this manner, the particles can be transferred down the liner 220 toward the area of the pumping ring 218 where they can be removed from the chamber 212. In a preferred embodiment, the grid 250 power would not be removed until the particles had been attracted to a grid segment, such as 250e, which is positioned below the surface of the semiconductor substrate 230

FIG. 4 also illustrates near the end the processing pressure cycle 108, pump purge cycles 110 occur, which increase the pressure above the normal processing pressure and subsequently reduce it rapidly down to the base pressure. As previously discussed, this has the effect of agitating the particles 235 to enable removal via the grid 250 effects discussed above.

It is understood that in addition to the grid power, and pressure, other parameters can be controlled with reference to the present invention. For example, the temperature of the chamber housing 211, or the contents within the chamber 212 could be controlled as well. To this end, it would be understood that the chamber housing 211 would include any needed heating apparatus. For example, the chamber housing 211 could have incorporated on or within its structure heating elements, including hollow tubing for transporting heated fluids.

By controlling the apparatus of the present invention via the methods described with reference FIG. 3 and FIG. 4, it can be seen that an active mechanism for removing particles from the process chamber and reducing particle contamination on a semiconductor substrate 230 more efficiently than the prior art has been demonstrated. In addition to the above discussed applications of the grid 250, it is understood that the power applied to the grid 250 can be reversed to create a potential having an opposite charge to repel particles from the lining 220 during a dedicated cleaning process. It would be understood by one skilled in the art that during such a cleaning process no semiconductor substrate 230 would be within the chamber as this would have an undesirable contamination effect. The opposite charge on such power grid 250 would tend remove any layer of particles formed upon the liner 220 such that replacement of the lining 220 would not need to occur as frequently, thereby increasing efficiency over the prior art.

The grid 250 is such that it can reside external to the chamber housing 211 of the process chamber 210 (as illustrated in FIG. 2), so long as the grid 250 attracts the particles 235 and has an insulation portion 252 such that persons external to the process chamber 210 are protected from the grid 250. In an alternative embodiment, it would be possible for the grid 250 to reside within the housing chamber 211, such that the liner 220 would be directly over the grid 250, or an insulation layer that insulates the grid 250 from the liner 220 as well.

It is further understood that it is possible to monitor processing parameters, such as how long a lining has been utilized and under what conditions, and control the grid 250 accordingly. For example, within a specific process chamber 210 the grid control signal 254 could automatically compensate for a polymer film build up by increasing the power applied to the grid 250. This build-up can be characterized over the life of the liner thereby allowing compensation for any potential buildup of particulates as a result of repeated processing steps, or floating gate effects introduced by the polymer film.

Thus it is apparent that there has been provided, in accordance with the present invention, an apparatus providing reduced particle contamination in a processing chamber. Although the invention has been described and illustrated with reference to the specific embodiment, it is not intended that the invention be limited to these illustrative embodiments. Those skilled in the art will recognize that modifications and variations may be made with departing from the spirit and scope of the invention. For example, while a vertical processing chamber 210 is illustrated in FIG. 2, a horizontal chamber could be used as well, in which case, the grid elements could be segmented such that particles would be directed toward a bottom of the chamber. This would require the use of a semicircular grid along the chamber housing that is perpendicular to the semiconductor substrate surface. In addition, the grid could be segmented to facilitate directing particles in a downward direction. Therefore, it is intended that this invention encompass all variations and modifications as fall within the scope of the appended claims.

What is claimed is:

1. A method for processing a semiconductor wafer, the method comprising the steps of:

placing the semiconductor wafer into a processing chamber having a periphery;

creating a processing environment within the processing chamber;

exposing the semiconductor wafer to the processing environment in order to alter a physical characteristic of the semiconductor wafer, the processing environment containing particles; and removing the particles from the processing chamber so that the particles do not come into contact with the semiconductor wafer by powering a grid located at the periphery of the processing chamber wherein the particles are attracted to and collide with the grid or a structure connected to the grid whereby this collision substantially reduces a particles motion for a period of time wherein the step of removing further comprises: providing a liner layer in the processing chamber wherein the grid attracts particles toward the liner layer when enabled, and enabling the grid such that the particles come into physical contact with the liner layer.

2. The method of claim 1 wherein the step of removing the particles comprises:

removing the particles by powering the grid to reduce deposition of the particles onto an active surface of the semiconductor wafer by gravity after the processing environment is terminated.

3. The method of claim 1 wherein the step of creating a processing environment comprises:

creating the processing environment as an etch plasma wherein the etch plasma is used to remove material from the semiconductor wafer and where powering of the grid is used to remove particles from the processing chamber after the particles are suspended by the etch plasma.

4. The method of claim 1 wherein the step of creating a processing environment comprises:

creating the processing environment as a deposition plasma wherein the deposition plasma is used to form deposited material on the semiconductor wafer and wherein powering of the grid is done to ensure that particles within the processing chamber are removed so that the particles are not incorporated into deposited material.

5. The method of claim 1 wherein the step of creating a processing environment comprises:

creating the processing environment as a sputtering environment wherein sputtered material is sputtered onto the semiconductor wafer and wherein powering of the grid is done to ensure that particles within the processing chamber are removed so that the particles are not incorporated into the sputtered material.

6. The method of claim 1 wherein the step of placing the semiconductor wafer into a processing chamber comprises:

placing the semiconductor wafer so that the semiconductor wafer is substantially vertically-oriented in the processing chamber so that an active surface of the semiconductor wafer and the processing environment are laterally adjacent each other.

7. The method of claim 1 wherein the step of placing the semiconductor wafer into a processing chamber comprises:

placing the semiconductor wafer so that the semiconductor wafer is substantially horizontally-oriented in the processing chamber so that an active surface of the semiconductor wafer underlies the processing environment.

8. The method of claim 1 wherein the step of removing the particles from the processing chamber comprises:

forming the liner layer of a material such that the particles do not strongly adhere to the liner layer.

9. The method of claim 1 wherein the step of removing the particles from the processing chamber comprises:

forming the liner layer having a substantially planar surface which does not mechanically trap particles.

10. The method of claim 1 wherein the step of removing the particles from the processing chamber comprises:

applying a voltage to the grid whereby the particles are prevented from being deposited on the semiconductor wafer by electrical attraction towards the grid.

11. The method of claim 1 wherein the step of removing the particles from the processing chamber comprises:

applying a voltage to the grid where the particles are prevented from being deposited on the semiconductor wafer by electrical attraction towards the grid, the particles being attracted to a point of the grid which is behind a plane defined by an active surface of the semiconductor wafer.

12. The method of claim 1 wherein the step of removing the particles from the processing chamber comprises:

applying a voltage which increases over time under computer control to compensate for residue buildup which may occur on a liner within the processing chamber.

13. The method of claim 12 wherein the step of removing the particles from the processing chamber comprises:

resetting the voltage to a lower starting voltage setting after cleaning the residue off of the liner.

14. The method of claim 1 wherein the step of removing the particles from the processing chamber comprises:

attracting the particles in a direction toward the grid; and
removing the particles from the processing chamber via gas flow within the processing chamber.

15. The method of claim 1 wherein the step of removing the particles from the processing chamber comprises:

attracting the particles in a direction toward the grid; and
removing the particles from the processing chamber via a vacuum created within the processing chamber.

16. The method of claim 1 wherein the step of removing the particles from the processing chamber comprises:

attracting the particles in a direction toward the grid by applying a first voltage to the grid, the first voltage thereby performing a particle collection step; and
aiding in removal of the particles from the processing chamber by applying a second voltage to the grid whereby the second voltage is different from the first voltage.

17. The method of claim 1 wherein the step of removing the particles from the processing chamber comprises:

providing the grid wherein the grid is segmented into a plurality of individually-controlled segments.

18. The method of claim 17 wherein the step of removing the particles from the processing chamber comprises:

providing independent voltage control for each segment within the plurality of individually-controlled segments of the grid.

19. The method of claim 17 wherein the step of removing the particles from the processing chamber comprises:

altering a voltage supplied to each individually-controlled segment of the grid over time in an automated manner to electrically transport particles attracted toward the grid to a pump port of the processing chamber.

20. The method of claim 17 wherein the step of removing the particles from the processing chamber comprises:

altering a voltage supplied to each individually-controlled segment of the grid over time in an automated manner to electrically transport particles below a plane defined by a top surface of the semiconductor wafer.

21. The method of claim 17 wherein the step of removing the particles from the processing chamber comprises:

altering a voltage supplied to at least one individually-controlled segment of the grid over time in response to changing process conditions within the processing chamber.

22. The method of claim 17 wherein the step of removing the particles from the processing chamber comprises:

altering a voltage supplied to at least one individually-controlled segment of the grid over time in response to a change in a physical position of a plasma in the processing chamber.

23. The method of claim 1 wherein the step of removing the particles from the processing chamber comprises:

pumping the processing chamber to a predetermined pressure;
enabling gas flow in the processing chamber; and
using vacuum effects to remove particles from the processing chamber.

24. The method of claim 1 wherein the step of removing the particles from the processing chamber comprises:

maintaining the grid in a disabled state until the processing environment is substantially completed with processing the semiconductor wafer.

25. The method of claim 1 wherein the step of removing the particles from the processing chamber comprises:

creating the processing environment as a plasma; and
enabling the grid only when the plasma is altered substantially in energy whereby particles which exit the plasma due to changing plasma energy are not deposited on the semiconductor wafer.

26. The method of claim 1 wherein the step of removing the particles from the processing chamber comprises:

ramping a pressure in the processing chamber up to a higher pressure and releasing the pressure to conduct particles from the processing chamber; and
again ramping the pressure in the processing chamber up to a higher pressure and releasing the pressure to conduct particles from the processing chamber.

27. The method of claim 1 wherein the step of removing the particles comprises:

removing the particles by powering the grid to reduce deposition of the particles onto an active surface of the semiconductor wafer by gravity after the processing environment is terminated.

28. The method of claim 1 where the processing chamber contains a wafer chuck powered to a voltage potential and wherein the step of removing the particles comprises:

powering the grid so that the particles are more attracted to the grid than to the wafer chuck.

29. A method for plasma processing a semiconductor wafer, the method comprising the steps of:
  inserting a wafer into a processing chamber using a mechanical arm, the processing chamber having a periphery;
  affixing the wafer to a chuck within the processing chamber;
  creating a plasma environment within the processing chamber, the plasma environment containing particles and being capable of physically altering the wafer;
  changing a power of the plasma environment;
  supplying a particle collection voltage to a grid located around a periphery of the processing chamber in response to the step of changing;
  electrically transporting particles towards the grid wherein a liner prevents the particles from coming into direct contact with the grid, the transporting preventing the particles from depositing on the wafer;
  changing the particle collection voltage on the grid while enabling at least one of a gas flow or a vacuum within the processing chamber to move the particles transported toward the grid to a pumping port on the periphery of the processing chamber; and
  removing the particles from the processing chamber through the pumping port.

30. The method of claim 29 wherein the periphery comprises an inner portion and an outer portion wherein the grid is located around the inner portion of the periphery.

31. The method of claim 29 wherein the periphery comprises an inner portion and an outer portion wherein the grid is located around the outer portion of the periphery.

32. The method of claim 29 wherein the step of changing the particle collection voltage on the grid includes reversing the voltage on the grid to remove particles from the liner during a cleaning process.

33. The method of claim 29, wherein the grid comprises a plurality of segments including a first segment and a second segment, wherein each of the plurality of segments is capable of being controlled independently.

34. The method of claim 33, wherein each segment is a coil.

35. The method of claim 33 wherein the first segment turns on at a first time and the second segment turns on at a second time.

36. The method of claim 33 wherein the first segment turns on over a first period of time and the second segment turns on over a second period of time.

37. The method of claim 33 wherein the first segment turns on at a third time and the second segment turns on at a fourth time.

38. The method of claim 33, wherein the first and second segment turn on and off such that the particles are directed toward the pumping port.

39. A method for plasma etch processing a semiconductor wafer, the method comprising the steps of:
  inserting a wafer having an active surface into a processing chamber having a periphery;
  affixing the wafer to a chuck within the processing chamber;
  creating a plasma etch environment within the processing chamber, the plasma etch environment containing particles selectively removing material from the active surface of the wafer;
  reducing a power of the plasma etch environment;
  supplying a particle collection voltage to a grid located around the periphery of the processing chamber in response to the step of selectively removing, the grid comprising a plurality of segments wherein each segment is independently-voltage controlled to attract particles at different rates toward the periphery of the processing chamber;
  electrically transporting particles towards the grid due to application of the particle collection voltage wherein a liner around a periphery of the processing chamber prevents the particles attracted to the grid from coming into direct contact with the grid, the transporting preventing the particles from depositing on the wafer as the power of the plasma is decreased;
  changing the particle collection voltage on the grid while enabling one or more of a gas flow or a vacuum within the processing chamber to move the particles transported toward the grid via electrical forces to a pumping port on the periphery of the processing chamber; and
  removing the particles from the processing chamber through the pumping port.

40. The method of claim 39 wherein the step of removing the particles from the processing chamber comprises:
  changing a temperature in the processing chamber to a different temperature to aid in removal of particles by changing thermal energies.

* * * * *